United States Patent
Perley

(10) Patent No.: US 12,072,378 B2
(45) Date of Patent: Aug. 27, 2024

(54) DEBUG STATE MACHINE TRIGGERED EXTENDED PERFORMANCE MONITOR COUNTER

(71) Applicant: ADVANCED MICRO DEVICES, INC., Santa Clara, CA (US)

(72) Inventor: Tim Perley, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 139 days.

(21) Appl. No.: 16/707,336

(22) Filed: Dec. 9, 2019

(65) Prior Publication Data

US 2021/0173004 A1 Jun. 10, 2021

(51) Int. Cl.
| | |
|---|---|
| *G01R 31/3177* | (2006.01) |
| *G06F 13/40* | (2006.01) |
| *G01R 31/3185* | (2006.01) |
| *G06F 11/07* | (2006.01) |
| *G06F 11/26* | (2006.01) |
| *G06F 11/36* | (2006.01) |

(52) U.S. Cl.
CPC ..... *G01R 31/3177* (2013.01); *G06F 13/4027* (2013.01); *G01R 31/3185* (2013.01); *G06F 11/079* (2013.01); *G06F 11/26* (2013.01); *G06F 11/3656* (2013.01); *G06F 11/3664* (2013.01)

(58) Field of Classification Search
CPC .... G06F 11/3656; G06F 11/079; G06F 11/26; G06F 11/3664; G06F 13/4027; G01R 31/3177; G01R 31/3185; G01R 31/3181
See application file for complete search history.

(56) References Cited

U.S. PATENT DOCUMENTS

| | | | |
|---|---|---|---|
| 5,812,830 A | 9/1998 | Naaseh-Shahry et al. | |
| 7,770,142 B1* | 8/2010 | Shmayovitsh | G06F 30/367 716/109 |
| 8,566,645 B2 | 10/2013 | Rentschler et al. | |
| 9,037,911 B2 | 5/2015 | Rentschler et al. | |
| 2006/0167658 A1 | 7/2006 | Mericas | |
| 2006/0212263 A1* | 9/2006 | Koehler | G06F 11/3466 702/182 |
| 2010/0321051 A1 | 12/2010 | Suzuki et al. | |
| 2012/0144240 A1 | 6/2012 | Rentschler et al. | |
| 2013/0019248 A1 | 1/2013 | Yu | |
| 2014/0053036 A1 | 2/2014 | Nixon et al. | |
| 2014/0075255 A1* | 3/2014 | Lee | G01R 31/3177 714/727 |

(Continued)

OTHER PUBLICATIONS

International Search Report and Written Opinion mailed Apr. 7, 2021 for PCT/US2020/063269, 9 pages.

(Continued)

*Primary Examiner* — April Y Blair
*Assistant Examiner* — Sazzad Hossain

(57) ABSTRACT

An integrated circuit (IC) includes a debug controller, a debug state machine (DSM), and an extended performance monitor counter (EPMC). The debug controller that selectively outputs debug data on a debug interconnect. The DSM identifies an event based on the debug data and an event list and outputs a DSM indication that identifies the event. The EPMC indicates a plurality of detected events including the identified event. The EPMC indicates the identified event in response to the DSM indication.

20 Claims, 5 Drawing Sheets

(56) References Cited

U.S. PATENT DOCUMENTS

| | | | |
|---|---|---|---|
| 2014/0122929 A1* | 5/2014 | Nixon | G06F 11/3656 |
| | | | 714/30 |
| 2014/0245076 A1* | 8/2014 | Bansal | G06F 11/366 |
| | | | 714/47.1 |
| 2015/0268302 A1 | 9/2015 | Hopkins et al. | |
| 2016/0086678 A1 | 3/2016 | Botea et al. | |
| 2016/0274187 A1 | 9/2016 | Menon et al. | |
| 2018/0164372 A1 | 6/2018 | Rubin et al. | |

OTHER PUBLICATIONS

International Preliminary Report on Patentability, Jun. 23, 2022 for PCT/US2020/063269, 6 pages.
Extended European Search Report issued in Application No. 20898841.0, mailed Nov. 30, 2023, 12 pages.

* cited by examiner

DEBUG STATE MACHINE TRIGGERED EXTENDED PERFORMANCE MONITOR COUNTER

BACKGROUND

As the complexity of integrated circuits (ICs) increases, testing, monitoring, and debugging those ICs becomes more complex. Automatic test equipment (ATE) and logic analyzers are used to provide given input values to fabricated chips. When an error is detected, signals of interest are tapped to determine the cause. In many cases, this process is time and labor intensive. On-chip logic and performance monitor counters (PMCs) are used to assist in IC debug, validation, and performance profiling. PMCs are used to track and indicate the occurrence of specific events, both during chip validation and during normal operation. However, without physically redesigning the IC, conventional PMCs typically track only a relatively small selection of events.

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

As described herein, in various embodiments, an integrated circuit (IC) includes at least one debug state machine (DSM) that sends indications to an extended performance monitor counter (EPMC). More specifically, the DSM receives debug data (e.g., via a debug interconnect), pipeline triggers (e.g., data from one or more intellectual property (IP) devices), or both. The DSM compares received data to a stored event list. In response to the comparison indicating an event specified by the event list has occurred, the DSM sends a DSM indication to the EPMC. The EPMC indicates, via an IC interface, that the specified event has been detected. Accordingly, the specified event is detected and indicated based on debug data, pipeline triggers, or both. In some cases, detecting and indicating information generated based on debug data, pipeline triggers, or both provides additional options for performance profiling, device debugging, validation coverage, or production workarounds.

In some implementations, the event list of the DSM is adjustable, such as via direct user input, via a basic input/output system (BIOS) update, or via a secure firmware update. In some embodiments, the event list is not a formal list of conditions stored together in a storage device, but rather a configuration of hardware that, when various specific sets of signals or triggers are received (e.g., corresponding to various specified events), generates an indication that a corresponding event has been detected. As a result, in some cases, the DSM indicates to the EPMC the occurrence of different events, as compared to prior to modifying the DSM. Further, the EPMC outputs indications of the occurrence of the different events. Thus, in some cases, the list of events reported by the EPMC is modified subsequent to fabrication of the EPMC, providing additional chip flexibility.

Some ICs include performance monitor counters (PMCs) that typically are not connected to a debug interconnect, pipeline devices (e.g., IP devices), or both. In such systems, the PMCs are limited to indicating data received from other sources, such as event-based interrupts. For example, in some cases, PMCs count specific power states entered and exited, but do not indicate a number of clock cycles spent in each power state, even though such information is, in some systems, available on a debug interconnect. Additionally, in some cases, the PMCs have a fixed architecture as part of fabrication of the PMCs. As a result, in those ICs, the PMCs are limited to indicating a fixed list of events which does not include at least some events that are indicated by a debug interconnect, pipeline triggers, or both. In some cases, it is desirable for a user or programmer to receive indications of events signaled by the debug interconnect, pipeline triggers or both or to change events indicated by the PMC after fabrication of the PMC.

Figure 1:
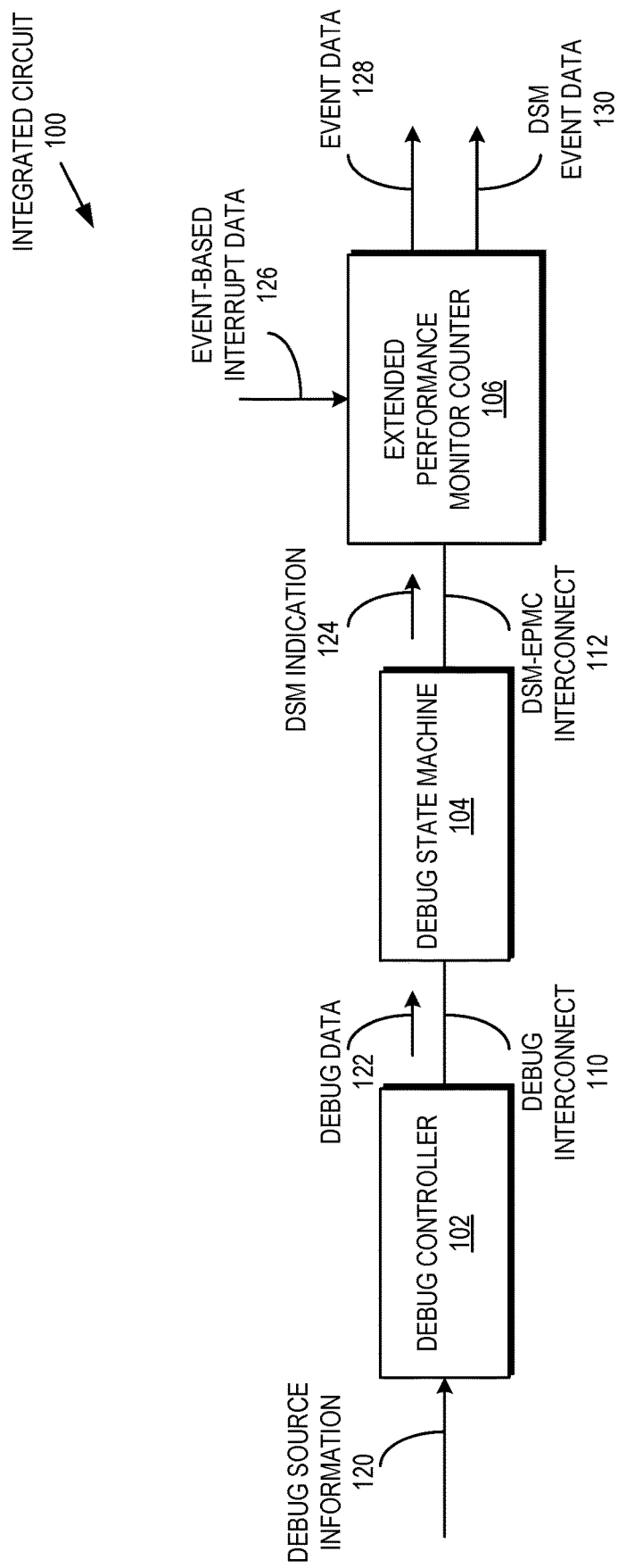
FIG. 1 is a block diagram of an implementation of an integrated circuit that includes a debug state machine and an extended performance monitor counter in accordance with some embodiments.

FIG. 1 illustrates an IC 100 in accordance with some embodiments. In the illustrated embodiment, IC 100 includes debug controller 102, DSM 104, and EPMC 106. Debug interconnect 110 connects debug controller 102 to DSM 104. DSM-EPMC interconnect 112 connects DSM 104 to EPMC 106. Although the illustrated embodiment only illustrates three components for clarity, in various embodiments, other components are contemplated.

In some embodiments, as further discussed below with reference to FIG. 5, IC 100 is part of a device such as a desktop or laptop computer, server, smartphone, tablet, game console, or other electronic device. The device includes a central processing unit (CPU), a graphics processing unit (GPU), a system memory controller, system input/output (IO) device and bus controller, and peripheral coprocessor elements. In various embodiments, any or all of these components incorporate DSMs and performance monitor counters. In various embodiments, any or all of these components send instruction-based sampling data 126 to EPMC 106, send debug source information 120 to debug controller 102 at various observability points, or both, as part of executing various programs or sequences of instructions.

In the illustrated embodiment, various debug source information 120 (e.g., a cross trigger signal on a communications interface, a trap signal, a clock stop signal, an error signal, a performance monitor ("perfmon") signal or event, an interrupt, a breakpoint, a microcode-based trigger (e.g., breakpoints, performance monitors, interrupts, and error events), a timer overflow, a resync on fault signal, a power state change signal, a power consumption signal, state signals of specific internal logic of the sending logic block, or any combination thereof) is provided to debug controller 102. In response to receiving debug source information 120, debug controller 102 selectively outputs debug source information 120 as debug data 122 on debug interconnect 110 (e.g., a debug bus). For example, in some cases, debug controller 102 includes one or more multiplexers and rotates between debug source information 120 inputs, outputting received data as debug data 122.

DSM 104 receives debug data 122 on debug interconnect 110 and compares the received data to an event list stored at DSM 104 (e.g., programmable event information). In response to determining that debug data 122 indicates a completed event, DSM 104 generates DSM indication 124, indicating that the completed event has been identified. In some embodiments, the event list includes multiple events. In other embodiments, the event list includes only a single event. In some embodiments, the event list is a configuration of hardware in DSM 104 that detects and indicates various events without storing conditions together in a memory device. In various embodiments, as further discussed below with reference to FIG. 3, DSM 104 identifies single condition events, multi-condition events, or both. For example, in some cases, DSM 104 generates DSM indication 124 in response to detecting a resync on fault signal. As another example, in some cases, in response to receiving debug data 122 that indicates a first power state transition (e.g., a transition into a particular phase), DSM 104 tracks a number of clock cycles spent in the particular phase of the power state transition. In response to receiving debug data 122 that indicates a second power state transition (e.g., a transition out of the particular phase), DSM 104 generates DSM indication 124. In some cases, DSM indication 124 indicates a number of cycles spent in the particular phase. Accordingly, in various embodiments, DSM 104 generates DSM indication 124 in response to debug data 122 indicating a particular state, generates DSM indication 124 in response to a sequence of signals, or both. Further, as described below with reference to FIG. 2, in various embodiments, DSM 104 generates various other control signals in response to various inputs (e.g., signals received via debug interconnect 110, or from other devices).

In the illustrated embodiment, an event list of DSM 104 is modifiable via an event list update. In some cases, the event list update is received directly from a user (e.g., as a custom event select input) to be used as needed for monitoring, profiling, and debugging. In other cases, the event list update is performed via a basic input/output system (BIOS) update or a secure firmware update (e.g., performed by a manufacturer of IC 100 in response to a request to monitor an event from a customer). Accordingly, in some cases, events identified by DSM 104 via DSM indication 124 are modified subsequent to fabrication of IC 100.

EPMC 106 counts and outputs indications of various events (e.g., providing a sampling profile or generating an input when a predetermined threshold is reached) associated with various operations (e.g., retired instructions) as event data 128. For example, in some cases, EPMC 106 receives, via event-based interrupt data 126, indications of power states entered and exited by one or more devices (e.g., a CPU) of IC 100, counts specific power states entered, and outputs a result as event data 128. Further, in the illustrated embodiment, EPMC 106 receives DSM indication 124 via DSM-EPMC interconnect 112 as a standard event and outputs DSM event data 130 in response to DSM indication 124. As a result, in some cases, EPMC 106 outputs event data 128 indicating a count of specific power states entered and further outputs DSM event data 130, indicating a number of cycles spent in a particular power state. In various embodiments, event data 128, DSM event data 130, or both is output via an input/output (I/O) interface (e.g., a user interface) or saved to an event log in a memory device. Accordingly, EPMC 106 outputs event data based on debug source information 120 received via debug interconnect 110, which, in some cases, includes additional information, as compared to event data generated solely based on event-based interrupt data 126. Further, as a result of the event list of DSM 104 being modifiable, in some cases, EPMC 106 is a customizable performance monitor.

Figure 2:
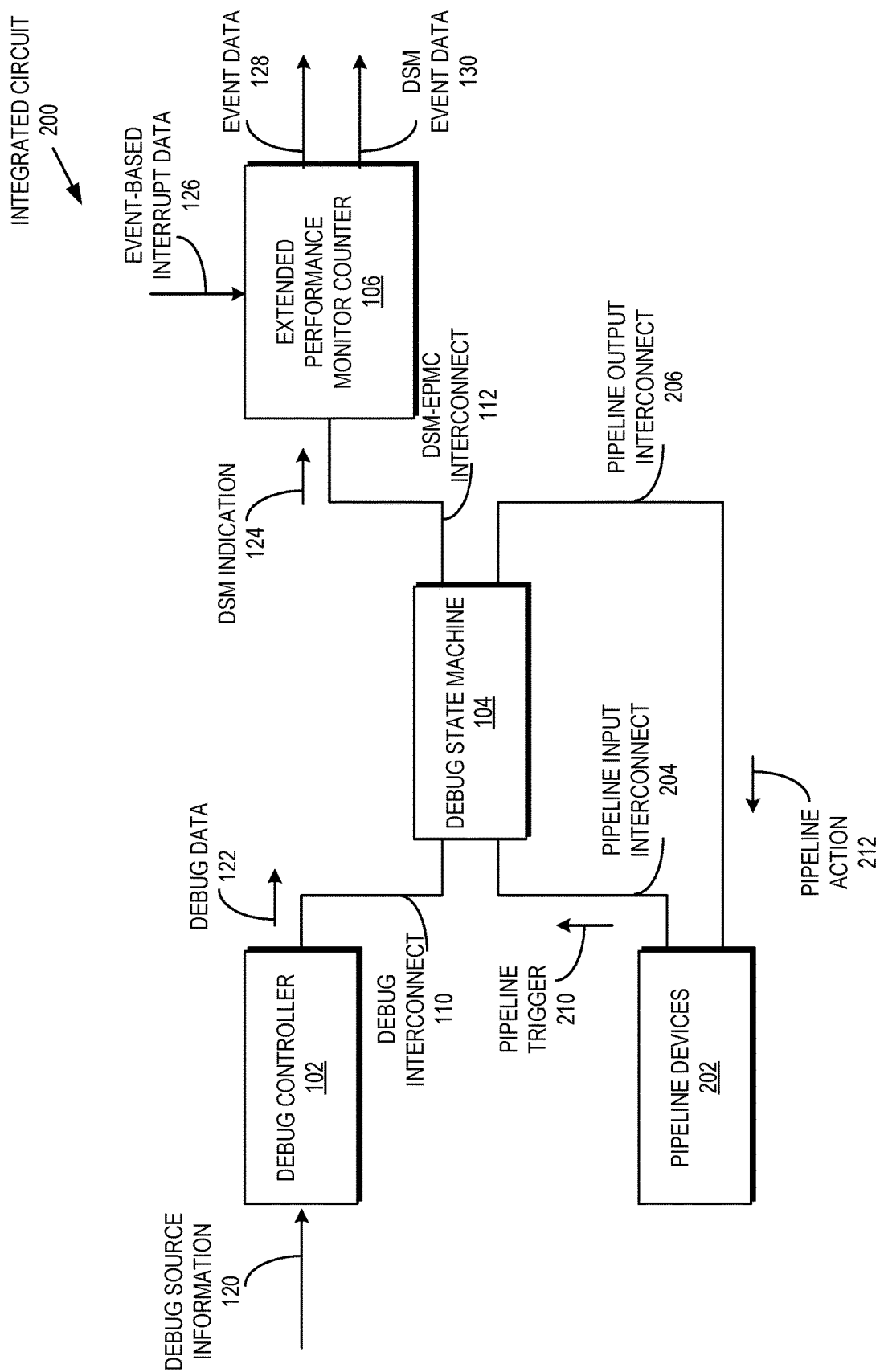
FIG. 2 is a block diagram of another implementation of an integrated circuit that includes a debug state machine and an extended performance monitor counter in accordance with some embodiments.

FIG. 2 is a block diagram illustrating an IC 200 in accordance with some embodiments. In the illustrated embodiment, IC 200 includes debug controller 102, DSM 104, EPMC 106, debug interconnect 110, and DSM-EPMC interconnect 112 of FIG. 1 and pipeline devices 202, pipeline input interconnect 204, and pipeline output interconnect 206. Although the illustrated embodiment only illustrates three components for clarity, in various embodiments, other components are contemplated.

As described above with reference to FIG. 1, in some embodiments, debug controller 102 generates debug data 122 based on debug source information 120. DSM 104 generates DSM indication 124 in response to detecting an event based on debug data 122. EPMC 106 generates event data 128 based on event-based interrupt data 126 and generates DSM event data 130 based on DSM indication 124.

Additionally, in the illustrated embodiment, DSM 104 generates DSM indication 124 in response to pipeline trigger 210 from pipeline devices 202 (e.g., in response to one or more instances of debug data 122, one or more instances of pipeline trigger 210, or any combination thereof). In various embodiments, pipeline devices 202 send pipeline triggers to DSM 104 (illustrated for simplicity as pipeline trigger 210) via pipeline input interconnect 204. For example, in some cases, pipeline trigger 210 includes one or more of: a trap signal, a clock stop signal, an error signal, a performance monitor ("perfmon") signal or event, an interrupt signal, a breakpoint indication, a microcode-based trigger (e.g., breakpoints, performance monitors, interrupts, and error events), and a timer overflow signal.

In addition to generating DSM indication 124, in some cases, DSM 104 generates pipeline action 212 in response to pipeline trigger 210, debug data 122, or both. DSM 104 sends pipeline actions (illustrated for simplicity as pipeline action 212) via pipeline output interconnect 206. Pipeline action 212 instructs pipeline devices 202 to perform various actions. For example, in some cases, pipeline action 212 includes one or more of: a local stop clock signal, a die-wide stop clock signal, a self-refresh signal for a memory device, a communication interface receive disable signal, a trace store signal, a machine check exception (MCE) signal, a debug event signal, a debug microcode interrupt trigger, an instruction to set and clear various bits in a DSM microcode register, an operation stall signal, a structure flush signal, an instruction to start storage of debug data to a state capture buffer (e.g., to a Debug Record Buffer (DRB) and to spill to reserved cache ways or system memory), an instruction to stop storage of debug data to a state capture buffer, an instruction to store a clock count to a state capture buffer, and an instruction to change the size of a queue.

Accordingly, in some cases, DSM 104 tracks data that is not indicated by event-based interrupt data 126. However, because EPMC 106 outputs DSM event data 130, this tracked data is, in some cases, transparent to a user. Further, because the event list of DSM 104 is modifiable, outputs of EPMC 106 are modifiable after fabrication of IC 200.

Figure 3:
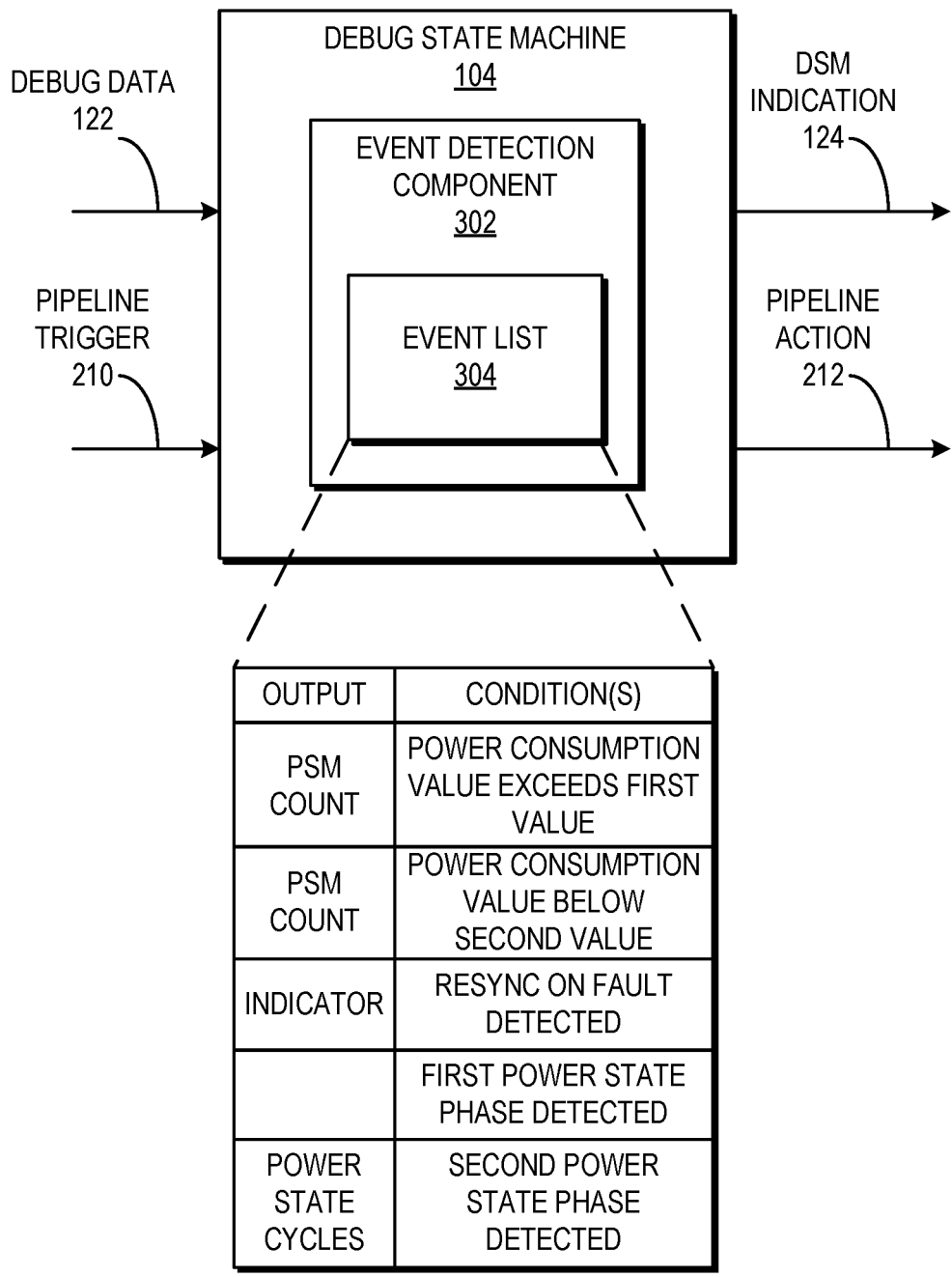
FIG. 3 is a block diagram illustrating an example debug state machine in accordance with some embodiments.

FIG. 3 is a block diagram depicting an example DSM 104 in accordance with some embodiments. DSM 104 includes event detection component 302. Event detection component 302 includes event list 304. Although, in the illustrated example, event list 304 includes multiple events, in other embodiments event list 304 only includes a single event. Additionally, although in the illustrated example, event list 304 corresponds to data (e.g., event conditions) stored together in a memory device, in other embodiments, event list 304 is a configuration of hardware in DSM 104 that detects and indicates various events without storing event conditions together in a memory device.

In the illustrated example, DSM 104 receives debug data 122, pipeline trigger 210, or both. Event detection component 302 compares the received data to event list 304 and determines, based on the comparison, whether an event has been detected. In response to detecting an event, DSM 104 sends DSM indication 124, indicating the detected event. Further, in the illustrated embodiment, event detection component 302 determines whether pipeline action 212 is generated based on the received data. However, in other embodiments, pipeline action 212 is generated using different hardware of DSM 104.

For illustrative purposes, FIG. 3 shows four examples of potential events that result in generating DSM indication 124. In particular, in response to debug data 122 indicating an internal power state monitor count where the power state monitor indicates a value above a first value, DSM 104 sends a DSM indication 124 that indicates the power state monitor count. As another example, in response to debug data 122 indicating an internal power state monitor count where the power state monitor indicates a value below a second value, DSM 104 sends DSM indication 124, indicating the power state monitor count. In some embodiments, the first value, the second value, or both are proxy values that indicate an observed die voltage within a range of die voltages of the integrated circuit. In other embodiments, the first value, the second value, or both are actual voltages. Further, in response to debug data 122 indicating that a resync on fault signal is high or in response to pipeline trigger 210 being active, DSM 104 sends DSM indication 124. Additionally, in some cases, events of event list 304 are multi-condition events. For example, in response to debug data 122 indicating that a first power state change has occurred, DSM 104 begins counting clock cycles (e.g., by increasing a counter or by marking a current counter value). In response to debug data 122 indicating that a second power state change has occurred, DSM 104 stops counting clock cycles and sends the number of counted clock cycles as DSM indication 124.

Figure 4:
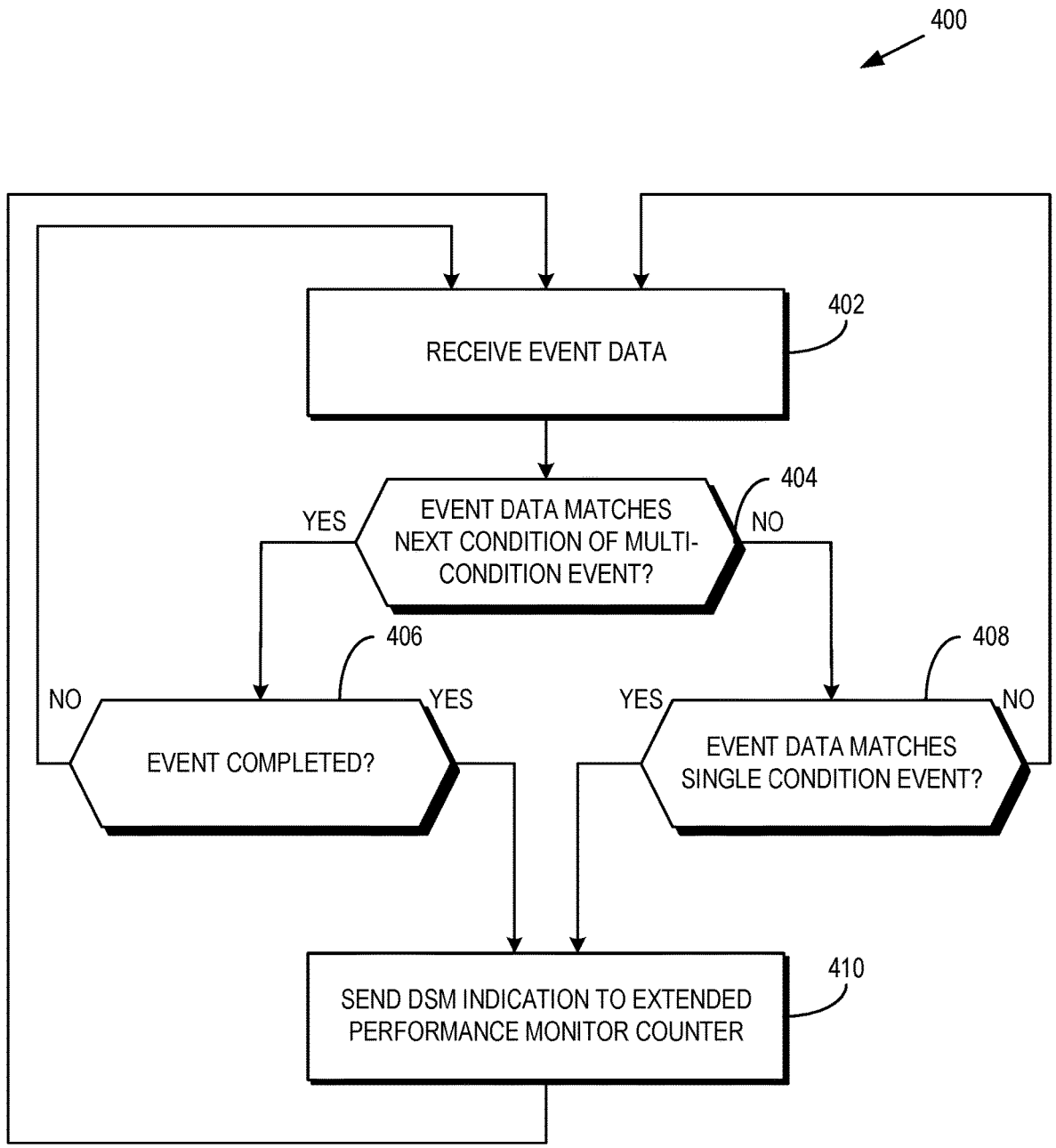
FIG. 4 is a flow diagram illustrating a method of detecting an event and providing a debug state machine indication to an extended performance monitor counter in accordance with some embodiments.

FIG. 4 is a flow diagram illustrating a method 400 of detecting an event and providing a debug state machine indication to an extended performance monitor counter in accordance with some embodiments. Method 400 is implemented, in some embodiments, by a DSM such as DSM 104 of FIG. 1. In some embodiments, method 400 is initiated by one or more processors in response to one or more instructions stored by a computer-readable storage medium.

At block 402, the DSM receives event data. For example, in some cases, DSM 104 receives debug data 122, pipeline trigger 210, or both. At block 404, the DSM determines whether the event data matches a next condition of a multi-condition event of the event list of the DSM. For example, in some cases, the event data indicates that a power state phase change has occurred, as discussed above with reference to FIG. 3. In response to the event data matching a next condition of a multi-condition event, method 400 proceeds to block 406. In response to the event data not matching a next condition of a multi-condition event, method 400 proceeds to block 402.

At block 406, in response to the event data matching a next condition of a multi-condition event, the DSM determines whether the event is completed as a result of receiving the event data. For example, in some cases, the event data indicates a second power state phase change has occurred. In response to the event being completed, method 400 proceeds to block 410. In response to the event not being completed, method 400 proceeds to block 402. At block 408, in response to the event data failing to match the next condition of a multi-condition event, the DSM determines whether the event data matches a single condition event of the event list. For example, in some cases, the event data indicates that a resync on fault signal is high or a pipeline trigger is asserted. In response to the event data matching a single condition event, method 400 proceeds to block 410. In response to the event data failing to match a single condition event, method 400 proceeds to block 402.

At block 410, in response to the multi-condition event being completed or in response to the event data matching a single condition event, the DSM sends a DSM indication to an extended performance monitor counter. For example, in response to identifying a completed event, DSM 104 sends DSM indication 124 to EPMC 106. Subsequently, method 400 returns to block 402. Accordingly, a method of detecting an event and providing a debug state machine indication to an extended performance monitor counter is depicted.

Figure 5:
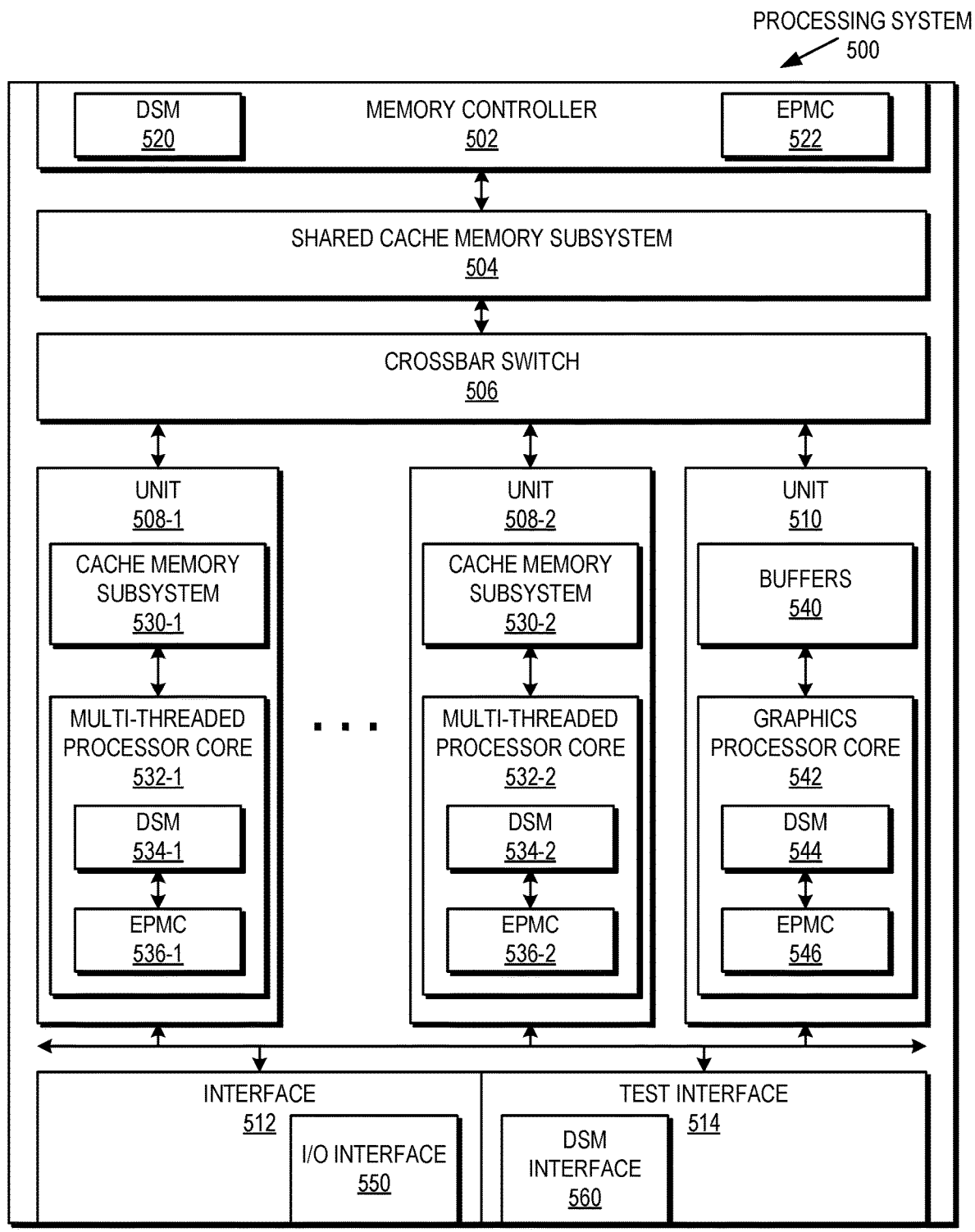
FIG. 5 is a block diagram of a processing system that includes a debug-state-machine-triggered extended performance monitor counter according to some embodiments.

FIG. 5 is a block diagram depicting of a processing system 500 that includes a debug state machine triggered extended performance monitor counter according to some embodiments. In the illustrated embodiment, various components within processing system 500 include a DSM and an EPMC for investigating and tracking functionality of the on-die hardware. As discussed above, DSMs receive triggers from one or more sources (e.g., debug data or pipeline triggers) and select a given action (e.g., sending a DSM indication or a pipeline action) based on the triggers. The sources include components within a same core or controller, other on-die components outside of the same core or controller, and additionally off-die components. In some embodiments, the DSMs are interconnected via a network (e.g., an overlay bidirectional cross trigger network). Although the illustrated embodiment includes DSMs and EPMCs in a variety of components, in other embodiments, DSMs and EPMCs are included in fewer, additional, or different components. Additionally, although DSMs and EPMCs are paired in the illustrated embodiment, in other embodiments, DSMs, EPMCs, or both appear separately.

In some cases, multiple time-sharing sequences occur in processing system 500. For example, in some cases, the sequences include software processes, software threads, system-level transactions, or power-performance states (p-states). A sequence includes one or more instructions to be executed on an IC under test that is scheduled by the OS or the on-die hardware. A sequence identifier (ID) is used to distinguish between sequences. For example, a process ID, a thread ID, a system-level transaction ID, a e-state ID, or any combination thereof is used. In some cases, sequences share hardware resources (e.g., execution units, queues, schedulers, process state, or memory space) within the IC with other sequences.

In some embodiments, one or more processor cores (e.g., multi-threaded processor cores 532-1 through 532-2 or graphics processor core 542) in processing system 500 execute multi-threaded applications. Additionally, in some cases, processing system 500 operates under one of multiple power-performance states. Further, in some cases, multiple independent system-level transaction levels operate on processing system 500. Each of a process, a thread, and a p-state is an example of a sequence.

In some embodiments, one or more of DSMs 520, 534 (DSMs 534-1 through 534-2), or 544 in processing system 500 track statistics and operating behavior including on-die interconnects and I/O device interconnect states. DSMs 520, 534, 544, or any combination thereof provide state information, stored parameters, and combinatorial control logic for testing the on-die hardware during processing of independent sequences. Rather than replicate a complete instantiation of a DSM for each sequence processed by the hardware, some static resources, such as state and stored parameters, are shared. As discussed above, one or more of DSMs 520, 534, and 544 include event lists that are modifiable after fabrication of processing system 500. As a result, in some cases, various tests and parameters tracked by DSMs 520, 534, and 544 are changed subsequent to fabrication of processing system 500.

As discussed above, one or more of EPMCs 522, 536 (EPMCs 536-1 through 536-2), or 546 similarly track and provide state information for debugging, code profiling and refinement, and operating system operation. In the illustrated embodiment, EPMCs 522, 536, and 546 receive DSM indications from one or more of DSMs 520, 534, and 544. In some cases, EPMCs 522, 536, and 546 output the received DSM indications as DSM event data. Further, in some cases, EPMCs 522, 536, and 546 combine the received DSM indications with received event-based interrupt data to generate event data.

As shown, processing system 500 includes various units 508 (general-purpose processing units 508-1 through 508-2) and unit 510 (e.g., a graphics processing unit). Units 508 include respective general-purpose, multi-threaded processor cores 532 and corresponding cache memory subsystems 530 (e.g., cache memory subsystems 530-1 through 530-2). Similarly, unit 510 includes graphics processor core 542 and buffers 540.

In some embodiments, each of multi-threaded processor cores 532 includes a superscalar microarchitecture with one or more multi-stage pipelines. In some cases, a multi-thread software application has each of its software threads processed by a separate pipeline within a respective one of multi-threaded processor cores 532. Alternatively, a pipeline that is able to process multiple threads via control at certain function units processes each one of the threads. In yet other examples, each one of the threads are processed by a pipeline with a combination of dedicated resources to a respective one of the multiple threads and shared resources used by all of the multiple threads. In various embodiments, each of multi-threaded processor cores 532 include circuitry for processing instructions according to a given general-purpose instruction set.

Generally, each of multi-threaded processor cores 532 accesses a level-one (L1) cache for data and instructions. In some cases, there are multiple on-die levels (L2, L3 and so forth) of caches. In some embodiments, one or more of these levels of caches are located outside the processor core and within a respective one of cache memory subsystems 530. Additionally, in some cases, processing system 500 includes one or more application specific cores, such as a GPU, another type of single-instruction-multiple-data (SIMD) core, or a digital signal processor (DSP). In the embodiment shown, processing system 500 includes unit 510. In the illustrated embodiment, unit 510 includes multiple parallel data paths that include multiple pipeline stages, where each stage has multiple arithmetic logic unit (ALU) components and operates on a single instruction for multiple data values in a data stream.

In the illustrated embodiment, processing system 500 further includes a shared cache memory subsystem 504 connected to units 508 and 510 through crossbar switch 506. The units 508 and 510 directly access both local memories and off-chip memory via crossbar switch 506 and memory controller 502.

In some cases, memory controller 502 connects processing system 500 to off-die memory devices, such as dynamic random-access memories (DRAMs), disk memories, and offline archive memories. Accordingly, memory controller 502 includes control circuitry for interfacing to memory devices. Additionally, in some embodiments, memory controller 502 includes request queues for queuing memory requests. Similar to units 508 and 510, in the illustrated embodiment, memory controller 502 includes DSM 520 and EPMC 522.

In the illustrated embodiment, interface 512 includes integrated channel circuitry to directly link signals to other processing nodes, such as another processor. Accordingly, in some cases, interface 512 utilizes one or more coherence links for inter-node access of processor on-die caches and off-die memory of another processing node. Examples of the technology include HyperTransport and QuickPath. I/O interface 550 provides an interface for I/O devices off processing system 500 to shared cache memory subsystem 504 and units 508 and 510. Further, in some cases, I/O interface 550 provides an interface to one or more of EPMCs 522, 536, and 546. In some cases, I/O interface 550 additionally communicates with a platform and I/O controller hub (not shown) for data control and access. In some cases, the hub responds to control packets and messages received on respective links and generates control packets and response packets in response to information and commands received from processing system 500. In some cases, the hub performs on-die the operations typically performed off-die by a conventional southbridge chipset. In some embodiments, the hub also includes a respective DSM, EPMC, or both.

Test interface 514 includes interface for testing processing system 500 according to a given protocol, such as the IEEE 1149.1 Standard Test Access Port and Boundary-Scan Architecture, or the Joint Test Action Group (JTAG) standards. In some cases, test interface 514 is used to program one or more of DSMs 520, 534, and 544 via DSM interface 560. In some embodiments, programming a DSM includes writing particular values in registers corresponding to the given DSM, such as registers corresponding to an event list. In some cases, programming a DSM determines to which triggers the DSM responds and the type of action taken in the response.

In some cases, DSMs 520, 534, and 544 are each be programmed differently. Alternatively, in some cases, two or more of the DSMs 520, 534, and 544 are programmed in a similar manner. In addition, in some cases, any given one of DSMs 520, 534, and 544 takes a particular action in response to a particular triggering event regardless of the performed programming. Similarly, in various embodiments, EPMCs 522, 536, and 546 are designed similarly or differently and report similar data or different data.

In some embodiments, a computer readable storage medium includes any non-transitory storage medium, or combination of non-transitory storage media, accessible by a computer system during use to provide instructions and/or data to the computer system. In various embodiments, such storage media includes, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. In some embodiments, the computer readable storage medium is embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. In some embodiments, the software includes the instructions and certain data that, when executed by the one or more processors, manipulate the one or more processors to perform one or more aspects of the techniques described above. For example, in some cases, the non-transitory computer readable storage medium includes a magnetic or optical disk storage device, solid state storage devices such as Flash memory, a cache, random access memory (RAM) or other non-volatile memory device or devices, and the like. In some embodiments, the executable instructions stored on the non-transitory computer readable storage medium are in source code, assembly language code, object code, or other instruction format that is interpreted or otherwise executable by one or more processors.

Note that not all of the activities or elements described above in the general description are required, that a portion of a specific activity or device are not required, and that one or more further activities are performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that cause any benefit, advantage, or solution to occur or become more pronounced are not to be construed as a critical, required, or essential feature of any or all the claims. Moreover, the particular embodiments disclosed above are illustrative only, as the disclosed subject matter could be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above could be altered or modified and all such variations are considered within the scope of the disclosed subject matter. Accordingly, the protection sought herein is as set forth in the claims below.

Within this disclosure, in some cases, different entities (which are variously referred to as "components," "units," "devices," etc.) are described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "memory device configured to store data" is intended to cover, for example, an integrated circuit that has circuitry that stores data during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible. Further, the term "configured to" is not intended to mean "configurable to." An unprogrammed field programmable gate array, for example, would not be considered to be "configured to" perform some specific function, although it could be "configurable to" perform that function after programming. Additionally, reciting in the appended claims that a structure is "configured to" perform one or more tasks is expressly intended not to be interpreted as having means-plus-function elements.

What is claimed is:

1. An integrated circuit (IC), comprising:
a debug controller configured to selectively output debug data on a debug interconnect;
a debug state machine (DSM) configured to:
identify an event based on the debug data and programmable event information; and
output, on an interconnect, a DSM indication in response to identifying the event; and
an extended performance monitor counter (EPMC) including one or more hardware counters configured to:
indicate a count of one or more power states entered by one or more devices of the IC; and
based on the DSM indication received via the interconnect, indicate a number of cycles the one or more devices spent in the one or more power states.

2. The IC of claim 1, wherein the the count of the one or more power states entered by the one or more devices of the IC is based on event-based interrupt data, wherein the event-based interrupt data is different from the debug data.

3. The IC of claim 1, wherein the DSM is further configured to identify the event based on at least one pipeline trigger.

4. The IC of claim 1, where the DSM is configured to receive the programmable event information via a basic input/output system (BIOS) update or a secure firmware update.

5. The IC of claim 1, wherein the DSM is configured to receive the programmable event information from a user.

6. The IC of claim 1, wherein the identified event is a multi-condition event comprising a first power phase transition and a second power phase transition, and wherein the DSM is further configured to output the DSM indication in response to determining that the debug data indicates the second power phase transition of the identified event.

7. The IC of claim 6, wherein the DSM indication includes a count of cycles passed between a first condition of the identified event and the last condition of the identified event.

8. The IC of claim 1, wherein the number of cycles the one or more devices spent in the one or more power states is stored in an event log of a memory device.

9. The IC of claim 1, wherein the interconnect comprises an on-die interconnect.

10. A method, comprising:
receiving, by a debug state machine (DSM) of an integrated circuit (IC), first debug data via a debug interconnect;
comparing, by the DSM, the first debug data to an event list stored at the DSM; and
in response to the first debug data matching a first portion of a first entry of the event list, sending, by a second interconnect, a DSM indication from the DSM to an extended performance monitor counter (EPMC) including one or more hardware counters that indicate:
a count of one or more power states entered by one or more devices of the IC; and
based on the DSM, indicating a number of cycles the one or more devices spent in the one or more power states,
wherein the second interconnect is configured to connect the DSM to the EPMC.

11. The method of claim 10, further comprising:
prior to receiving the first debug data, receiving, by the DSM, second debug data matching a second portion of the first entry, wherein the first entry corresponds to a multi-condition event, and wherein the first portion of the first entry corresponds to a last condition of the multi-condition event.

12. The method of claim 10, further comprising, subsequent to sending the DSM indication, receiving, by the DSM, an update to the event list.

13. The method of claim 12, further comprising:
subsequent to receiving the update to the event list, receiving, by the DSM, second debug data via the debug interconnect;
comparing, by the DSM, the second debug data to the event list; and
in response to the second debug data matching an updated first portion of the first entry of the event list, sending a second DSM indication to the EPMC that indicates that a second event has been detected, wherein the second event is different from the first event, and wherein the DSM indication is the same as the second DSM indication.

14. The method of claim 12, wherein receiving the update to the event list comprises receiving the update via a basic input/output system (BIOS) update or a secure firmware update.

15. The method of claim 12, wherein receiving the update to the event list comprises receiving the update from a user.

16. An integrated circuit (IC), comprising:
a debug state machine (DSM) configured to:
identify an event based on an event list stored at the DSM in response to receiving debug data and pipeline trigger data; and
output a DSM indication in response to identifying the event;
an extended performance monitor counter (EPMC) including one or more hardware counters configured to:
indicate a count of a plurality of power states entered by one or more devices of the IC; and
based on the DSM indication, indicate a respective number of cycles that the one or more devices spent in a corresponding power state of the plurality of power states; and
an interconnect configured to connect the DSM to the EPMC, wherein the DSM is configured to send the DSM indication to the EPMC via the interconnect.

17. The IC of claim 16, wherein indicating the identified event comprises indicating a count of clock cycles during which the identified event occurred.

18. The IC of claim 17, wherein the identified event comprises a power state phase change.

19. The IC of claim 17, wherein the DSM indication comprises a power state monitor count.

20. The IC of claim 16, wherein the identified event comprises a resync on fault event.

* * * * *